(12) United States Patent
Kohda (10) Patent No.: US 7,939,429 B2
(45) Date of Patent: May 10, 2011

(54) NITRIDE SEMICONDUCTOR DEVICE AND METHOD OF MANUFACTURING THE SAME

(75) Inventor: Shinichi Kohda, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 237 days.

(21) Appl. No.: 12/219,539

(22) Filed: Jul. 23, 2008

(65) Prior Publication Data

US 2009/0046754 A1 Feb. 19, 2009

(30) Foreign Application Priority Data

Jul. 25, 2007 (JP) ................... 2007-193409

(51) Int. Cl.
*H01L 21/20* (2006.01)
*H01S 3/04* (2006.01)
(52) U.S. Cl. ............. 438/463; 438/460; 372/43.01
(58) Field of Classification Search ......... 372/43.01; 438/460–463
See application file for complete search history.

(56) References Cited

U.S. PATENT DOCUMENTS

| 7,241,669 B2 * | 7/2007 | Swenson et al. ............. 438/463 |
| 7,473,866 B2 * | 1/2009 | Morishige et al. ........ 219/121.76 |
| 2005/0101108 A1 * | 5/2005 | Genda et al. ............... 438/462 |
| 2005/0202596 A1 | 9/2005 | Fukuyo et al. |
| 2005/0277270 A1 * | 12/2005 | Yoshikawa et al. ......... 438/463 |
| 2005/0282360 A1 * | 12/2005 | Kida et al. ................... 438/462 |
| 2006/0011593 A1 | 1/2006 | Fukuyo et al. |
| 2006/0105544 A1 * | 5/2006 | Takanashi et al. ........... 438/460 |
| 2006/0154449 A1 * | 7/2006 | Kobayashi ................... 438/462 |
| 2008/0070380 A1 * | 3/2008 | Kusunoki .................... 438/462 |

FOREIGN PATENT DOCUMENTS

| JP | 2003-338652 | 11/2003 |
| JP | 2005-116844 | 4/2005 |

* cited by examiner

*Primary Examiner* — Minsun Harvey
*Assistant Examiner* — Phillip Nguyen
(74) *Attorney, Agent, or Firm* — Rabin & Berdo, PC (57) ABSTRACT

A method of manufacturing a nitride semiconductor device includes the steps of: forming a division guide groove by applying a laser beam having a wavelength and energy density causing multiphoton absorption to a surface of a substrate having a group III nitride semiconductor layer grown on a major surface thereof; removing deposits from the surface of the substrate by applying a laser beam having the wavelength to the surface of the substrate at energy density causing substantially no multiphoton absorption on the substrate; and dividing the substrate along the division guide groove.

6 Claims, 6 Drawing Sheets

NITRIDE SEMICONDUCTOR DEVICE AND METHOD OF MANUFACTURING THE SAME

BACKGROUND OF THE INVENTION

1. Field of the Invention

The present invention relates to a nitride semiconductor device having a structure obtained by forming group III nitride semiconductors on a substrate and a method of manufacturing the same. Group III nitride semiconductors are group III-V semiconductors employing nitrogen as a group V element, and typical examples thereof include aluminum nitride (AlN), gallium nitride (GaN) and indium nitride (InN), which can be generally expressed as $Al_xIn_yGa_{1-x-y}N$ ($0 \leq x \leq 1$, $0 \leq y \leq 1$ and $0 \leq x+y \leq 1$).

2. Description of Related Art

A semiconductor light emitting device having a structure obtained by growing a group III nitride semiconductor layer on a GaN substrate is known in general. Typical examples thereof include a blue light emitting diode and a blue semiconductor laser. In addition to such light emitting devices, the group III nitride semiconductor is applied to transistors such as a power transistor and a high electron mobility transistor.

In the case of the light emitting device, the group III nitride semiconductor layer has a multilayer structure obtained by stacking an n-type GaN layer, an active layer (light emitting layer) and a p-type GaN layer from the side of the GaN substrate, for example. According to this structure, electrons and positive holes are recombined in the active layer to emit light.

A group III nitride semiconductor substrate made of GaN or the like is inferior in cleavability as compared with a substrate made of GaAs or the like generally applied to a light emitting diode or a laser diode. If division guide grooves such as scribing lines are formed in a step of dividing the semiconductor substrate into individual chips, dividing positions deviate from the division guide grooves in a subsequent breaking step, and the chip shapes cannot be stabilized.

In order to solve this problem, deep division guide grooves may be formed on a GaN substrate by laser processing (refer to Japanese Unexamined Patent Publication No. 2005-116844). When the grooves are formed on the surface of the substrate, however, the substrate material is heated and scattered around as debris, to adhere to the surface of the substrate and contaminate the same. This debris causes a defective appearance, defective die bonding, defective wire bonding, etc.

SUMMARY OF THE INVENTION

An object of the present invention is to provide a nitride semiconductor device improvable in reliability etc. and a method of manufacturing the same by reducing the quantity of deposits, resulting from laser processing, adhering to the surface of a substrate.

A method of manufacturing a nitride semiconductor device according to one aspect of the present invention includes the steps of: forming a division guide groove by applying a laser beam having a wavelength and energy density causing multiphoton absorption to the surface of a substrate having a group III nitride semiconductor layer grown on the major surface thereof; removing deposits (particularly debris resulting from transformation and scattering of the substrate material in the step of forming the division guide groove) from the surface of the substrate by applying a laser beam having the wavelength to the surface of the substrate at energy density causing substantially no multiphoton absorption on the substrate; and dividing the substrate along the division guide groove.

According to this method, the division guide groove is formed on the surface of the substrate by laser processing utilizing multiphoton absorption. Thereafter the laser beam is applied at the energy density causing no multiphoton absorption on the substrate. This laser beam is not absorbed by the substrate, but absorbed by the deposits on the surface of the substrate. The main deposit on the surface of the substrate is the debris resulting from transformation and scattering of the substrate material in the step of forming the division guide groove. This debris is a transformed substrate material adhering to the surface of the substrate in the vicinity of the division guide groove. Then, the debris is sublimated by absorbing the laser beam having the wavelength not absorbed by the substrate material. Thus, the deposits can be selectively removed from the surface of the substrate without damaging the substrate, and the surface of the substrate can be cleaned. Consequently, the device causes no defective appearance, and the reliability thereof can be improved.

A method of manufacturing a nitride semiconductor device according to another aspect of the present invention includes the steps of: forming a division guide groove along a direction parallel to a resonator of a laser diode by applying a laser beam having a wavelength and energy density causing multiphoton absorption to the surface of a substrate having a group III nitride semiconductor layer for forming the laser diode grown on the major surface thereof; removing deposits (particularly debris resulting from transformation and scattering of the substrate material in the step of forming the division guide groove) from the surface of the substrate by applying a laser beam having the wavelength to the surface of the substrate at energy density causing substantially no multiphoton absorption on the substrate; and dividing the substrate along the division guide groove.

According to this method, the substrate is divided in relation to the direction parallel to the laser resonator by a technique similar to the aforementioned method. In relation to a direction orthogonal to the laser resonator, the substrate can be divided by cleavage, for example.

If end faces of the resonator are formed by c-planes, for example, it is difficult to divide the substrate by cleavage in relation to the direction (a-plane or m-plane, for example) parallel to the laser resonator. Therefore, a deep division guide groove is formed by laser processing utilizing multiphoton absorption, and the substrate is divided along this division guide groove. Deposits (debris adhering to a portion around the division guide groove) resulting from the formation of the division guide groove are removed from the surface of the substrate by the application of the laser beam having low energy density. Thus, a nitride semiconductor laser having an excellent appearance and high reliability can be provided.

If the substrate is made of a group III nitride semiconductor, the application of the laser beam in each of the steps of forming the division guide groove and removing the deposits preferably includes a step of applying a laser beam having a wavelength of 500 nm to 700 nm. The laser beam in this wave range is employed at proper strength such that the surface of the substrate can be processed by multiphoton absorption and the deposits can be removed from the surface of the substrate without damaging the substrate.

The step of forming the division guide groove may include a step of scanning the substrate with the laser beam in a prescribed region, and the step of removing the deposits from the surface of the substrate may include a step of scanning the substrate with the laser beam over a region wider than the prescribed region along the laser beam scanning direction. In the laser processing for forming the division guide groove, the laser beam of high energy density is applied so that multiphoton absorption can be caused on the substrate material. If the laser processing is performed up to edges of the substrate, the high-energy laser beam may be applied to a holder (adhesive sheet to which the substrate is bonded, for example) holding the substrate, and may lead to damage of the holder. In the laser processing for removing the debris, on the other hand, the laser beam is applied at relatively low energy density, and hence there is a little possibility that the holder is remarkably damaged by the laser beam. Therefore, the laser processing for forming the division guide groove is preferably performed in relation to only the prescribed region (preferably, a central region not reaching the edges of the substrate), and the laser processing for removing the debris is preferably performed in relation to the range wider than the prescribed region. Thus, the holder is not damaged, and the debris can be reliably removed from the substrate.

Preferably, the energy density of the laser beam in the step of removing the deposits is smaller than the energy density of the laser beam in the step of forming the division guide groove. Thus, the deposits can be removed from the portion around the division guide groove, while suppressing damage on the substrate.

Preferably, a focal position of the laser beam in the step of removing the deposits is varied such that the region of the substrate irradiated with the laser beam in the step of removing the deposits is wider than the region of the substrate irradiated with the laser beam in the step of forming the division guide groove. Thus, the deposits can be cleaned from the portion around the division guide groove.

The division guide groove may be formed on the surface of the substrate provided with the group III nitride semiconductor layer. In this case, the division guide groove is preferably formed up to a depth passing through the group III nitride semiconductor layer and reaching the underlaid substrate. The division guide groove may alternatively formed on the surface of the substrate opposite to the group III nitride semiconductor layer.

A group III nitride semiconductor substrate, a sapphire substrate or an SiC substrate may be employed as the substrate. If the sapphire or SiC substrate is employed, a laser beam having a wavelength of 355 nm is preferably employed. The division guide groove can be formed through multiphoton absorption by applying the laser beam having this wavelength at high energy density. Further, the deposits can be removed from the surface of the substrate without damaging the substrate material by applying the laser beam having this wavelength at low energy density.

A nitride semiconductor device according to still another aspect of the present invention is formed by growing a group III nitride semiconductor layer on the major surface of a substrate, having a two-stage laser trace on a device edge portion.

This nitride semiconductor device can be prepared by forming a division guide groove on the surface of the substrate by laser processing utilizing multiphoton absorption and applying a laser beam to the substrate at energy density causing no multiphoton absorption on the substrate, for example. When the substrate is divided along the division guide groove, a two-stage laser trace is formed on the device edge portion. Debris resulting from transformation and scattering of the substrate material in formation of the division guide groove is sublimated by the subsequent application of the laser beam. Thus, a device having high reliability with no defective appearance can be implemented.

The laser trace may include a first processed surface and a second processed surface having different inclination angles. The trace of the two-stage laser processing appears as the first processed surface and the second processed surface having different inclination angles. For example, the processed surface resulting from the laser processing for forming the division guide groove on the surface of the substrate is more steeply inclined than the processed surface resulting from the laser processing for removing the debris.

The laser trace may include a first region and a second region having different depths of processing. For example, the laser-processed region for forming the division guide groove and the laser-processed region for removing the debris may not coincide with each other. In this case, the region provided with the division guide groove has a large depth of processing, while the region subjected to only the laser processing for removing the debris has a small depth of processing.

The first region may be formed at the center in a laser beam scanning direction, and the second region may be formed on an end portion in the laser beam scanning direction. In this case, the depth of processing of the first region may be larger than the depth of processing of the second region. In the laser processing for forming the division guide groove, a laser beam having high energy density is applied to the substrate, so that multiphoton absorption can be caused on the substrate material. If the laser processing is performed up to edges of the substrate, the high-energy laser beam may be applied to a holder (adhesive sheet to which the substrate is bonded, for example) holding the substrate, and may lead to damage of the holder. In the laser processing for removing the debris, on the other hand, the laser beam is applied at relatively low energy density, and hence there is a little possibility that the holder is remarkably damaged by the laser beam. Therefore, the laser processing for forming the division guide groove is preferably performed in relation to only the first region at the center in the laser beam scanning direction, and the laser processing for removing the debris is preferably performed in relation to the overall region in the laser beam scanning direction. Thus, the holder is not damaged, and the debris can be reliably removed from the substrate. In this case, the second region provided on the end portion in the laser beam scanning direction is subjected to only the laser processing for removing the debris, to have a small depth of processing. In other words, the first region has a larger depth of processing than the second region.

When the group III nitride semiconductor layer forms a laser diode having a resonator, the laser trace may be formed parallelly to the resonator. If end faces of the resonator are formed by c-planes, for example, it is difficult to divide the substrate by cleavage in relation to the direction (a-plane or m-plane, for example) parallel to the laser resonator. Therefore, a deep division guide groove is formed by the laser processing utilizing multiphoton absorption, and the substrate is divided along this division guide groove. Deposits (debris adhering to a portion around the division guide groove) resulting from the formation of the division guide groove are removed from the surface of the substrate by the application of the laser beam having low energy density. Thus, a nitride semiconductor laser having high reliability with no defective appearance can be provided through the two-stage laser processing.

The foregoing and other objects, features and effects of the present invention will become more apparent from the following detailed description of the preferred embodiments with reference to the attached drawings.

DETAILED DESCRIPTION OF PREFERRED EMBODIMENTS

Figure 1:
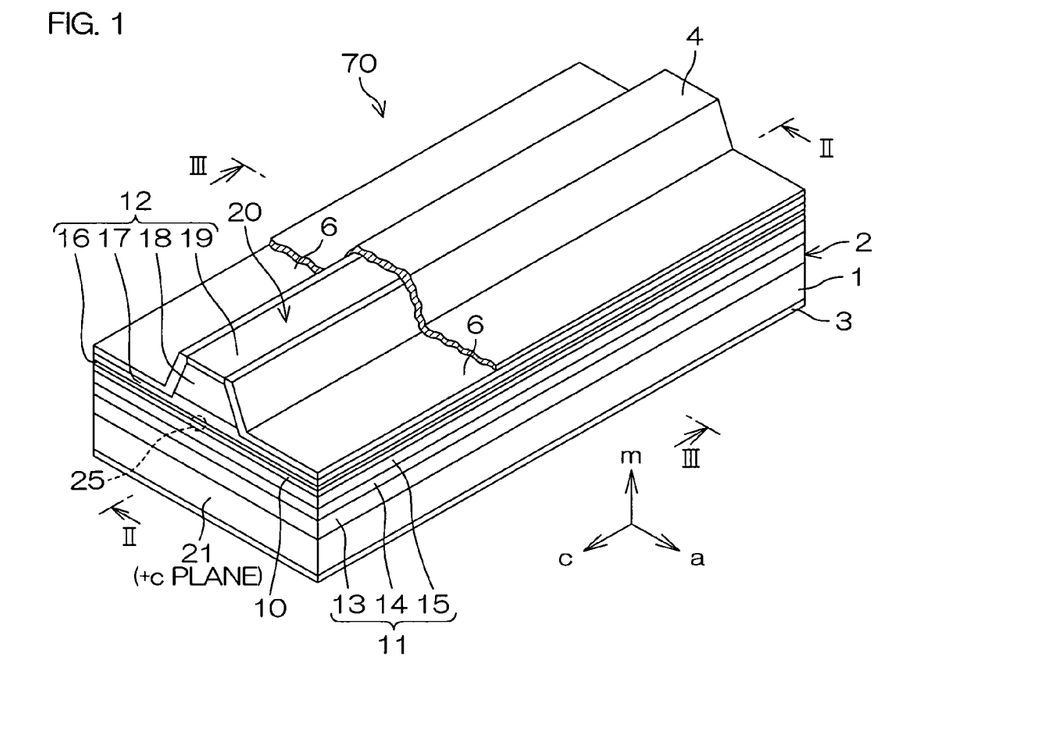
FIG. 1 is a perspective view for illustrating the structure of a semiconductor laser diode manufactured according to a method of manufacturing a nitride semiconductor device according to an embodiment of the present invention.
Figure 2:
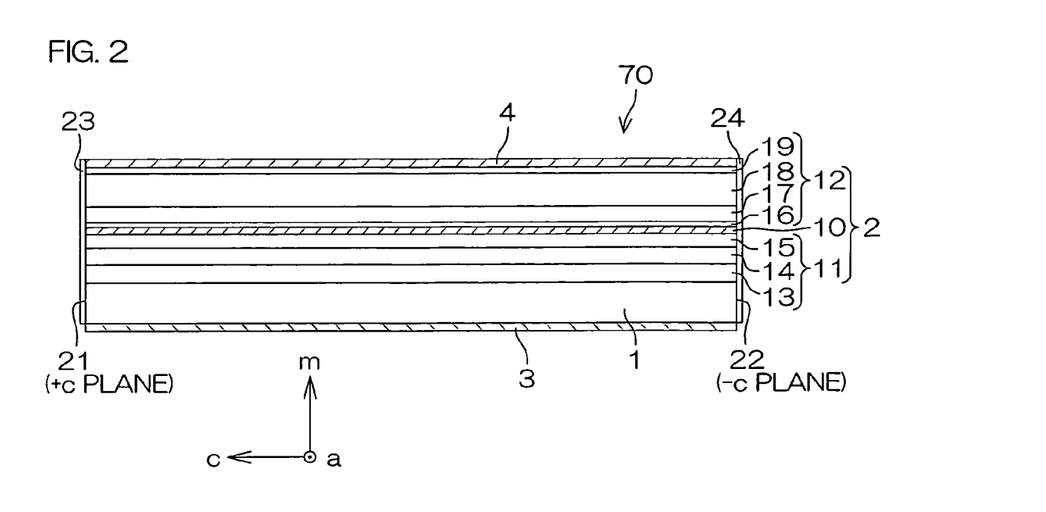
FIG. 2 is a longitudinal sectional view taken along a line II-II in FIG. 1.
Figure 3:
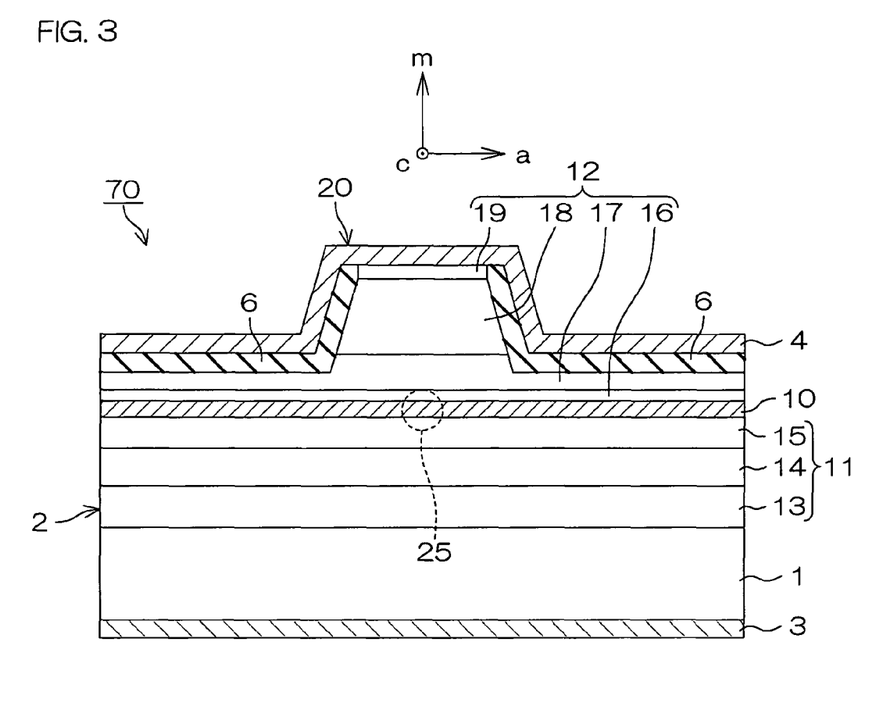
FIG. 3 is a cross sectional view taken along a line III-III in FIG. 1.

FIG. 1 is a perspective view for illustrating the structure of a semiconductor laser diode manufactured according to a method of manufacturing a nitride semiconductor device according to an embodiment of the present invention, FIG. 2 is a longitudinal sectional view taken along a line II-II in FIG. 1, and FIG. 3 is a cross sectional view taken along a line III-III in FIG. 1. Referring to FIGS. 1 to 3, arrows c, m and a denote the c-axis direction, the m-axis direction and the a-axis direction respectively.

This semiconductor laser diode 70 is a Fabry-Perot laser diode including a substrate 1, a group III nitride semiconductor multilayer structure 2 (group III nitride semiconductor layer) 2 formed on the substrate 1 by crystal growth, an n-side electrode 3 formed in contact with the back surface of the substrate 1 (surface opposite to the group III nitride semiconductor multilayer structure 2) and a p-side electrode 4 formed in contact with the surface of the group III nitride semiconductor multilayer structure 2.

According to this embodiment, the substrate 1 is constituted of a GaN monocrystalline substrate. This substrate 1 has a major surface defined by a nonpolar plane, for example. The nonpolar plane is the a-plane or the m-plane. The group III nitride semiconductor multilayer structure 2 is formed by crystal growth on this major surface. Therefore, the group III nitride semiconductor multilayer structure 2 consists of group III nitride semiconductors having major crystal growth planes defined by nonpolar planes. As to the size of the substrate 1, the length along the c-axis direction (direction parallel to the a-plane) is 250 µm to 600 µm, and the length along the a-axis direction (direction parallel to the c-axis) is 200 µm to 400 µm, for example.

The group III nitride semiconductor multilayer structure 2 includes a light emitting layer 10, an n-type semiconductor layered portion 11 (a first layer of a first conductivity type) and a p-type semiconductor layered portion 12 (a second layer of a second conductivity type). The n-type semiconductor layered portion 11 is disposed on a side of the light emitting layer 10 closer to the substrate 1, while the p-type semiconductor layered portion 12 is disposed on a side of the light emitting layer 10 closer to the p-side electrode 4. Thus, the light emitting layer 10 is held between the n-type semiconductor layered portion 11 and the p-type semiconductor layered portion 12, whereby a double hetero junction structure is provided. Electrons are injected into the light emitting layer 10 from the n-type semiconductor layered portion 11, while positive holes are injected thereinto from the p-type semiconductor layered portion 12. The electrons and the positive holes are recombined in the light emitting layer 10, to emit light.

The n-type semiconductor layered portion 11 is formed by successively stacking an n-type GaN contact layer 13 (having a thickness of 2 µm, for example), an n-type AlGaN cladding layer 14 (having a thickness of not more than 1.5 µm such as a thickness of 1.0 µm, for example) and an n-type GaN guide layer 15 (having a thickness of 0.1 µm, for example) from the side closer to the substrate 1. On the other hand, the p-type semiconductor layered portion 12 is formed by successively stacking a p-type AlGaN electron blocking layer 16 (having a thickness of 20 nm, for example), a p-type GaN guide layer 17 (having a thickness of 0.1 µm, for example), a p-type AlGaN cladding layer 18 (having a thickness of not more than 1.5 µm such as a thickness of 0.4 µm, for example) and a p-type GaN contact layer 19 (having a thickness of 0.3 µm, for example) on the light emitting layer 10.

The n-type GaN contact layer 13 and the p-type GaN contact layer 19 are low-resistance layers for attaining ohmic contact with the n-side electrode 3 and the p-side electrode 4 respectively. The n-type GaN contact layer 13 is made of an n-type semiconductor prepared by doping GaN with Si, for example, serving as an n-type dopant in a high doping concentration ($3 \times 10^{18}$ cm$^{-3}$, for example). The p-type GaN contact layer 19 is made of a p-type semiconductor prepared by doping GaN with Mg serving as a p-type dopant in a high doping concentration ($3 \times 10^{19}$ cm$^{-3}$, for example).

The n-type AlGaN cladding layer 14 and the p-type AlGaN cladding layer 18 provide a light confining effect confining the light emitted by the light emitting layer 10 therebetween. The n-type AlGaN cladding layer 14 is made of an n-type semiconductor prepared by doping AlGaN with Si, for example, serving as an n-type dopant (in a doping concentration of $1 \times 10^{18}$ cm$^{-3}$, for example). The p-type AlGaN cladding layer 18 is made of a p-type semiconductor prepared by AlGaN with Mg serving as a p-type dopant (in a doping concentration of $1 \times 10^{19}$ cm$^{-1}$, for example).

The n-type GaN guide layer 15 and the p-type GaN guide layer 17 are semiconductor layers providing a carrier confining effect for confining carriers (electrons and positive holes) in the light emitting layer 10. Thus, the efficiency of recombination of the electrons and positive holes is improved in the light emitting layer 10. The n-type GaN guide layer 15 is made of an n-type semiconductor prepared by doping GaN with Si, for example, serving as an n-type dopant (in a doping concentration of $1 \times 10^{18}$ cm$^{-3}$, for example). The p-type GaN guide layer 17 is made of a p-type semiconductor prepared by GaN with Mg, for example, serving as a p-type dopant (in a doping concentration of $5 \times 10^{18}$ cm$^{-3}$, for example).

The p-type AlGaN electron blocking layer 16 is made of a p-type semiconductor prepared by doping AlGaN with Mg, for example, serving as a p-type dopant (in a doping concentration of $5 \times 10^{18}$ cm$^{-3}$, for example). The p-type AlGaN electron blocking layer 16 prevents electrons from flowing out of the light emitting layer 10 and improving the efficiency of recombination of the electrons and the positive holes.

The light emitting layer 10 has an MQW (multiple-quantum well) structure containing InGaN, for example, and is a layer for emitting light by recombination of the electrons and the positive holes and amplifying the emitted light. More specifically, the light emitting layer 10 is formed by alternately repetitively stacking a plurality of InGaN sublayers (each having a thickness of 3 nm, for example) and a plurality of GaN sublayers (each having a thickness of 9 nm, for example). In this case, the In composition ratio of each InGaN layer is set to not less than 5%, so that the InGaN layer has a relatively small band gap and constitutes a quantum well layer. On the other hand, each GaN layer functions as a barrier layer having a relatively large band gap. The InGaN layers and the GaN layers are alternately repetitively stacked by two to seven cycles, for example, to constitute the light emitting layer 10 having the MQW structure. The emission wavelength of the light emitting layer 10 is set to 400 nm to 550 nm, for example, by controlling the In composition in the quantum well layers (InGaN layers).

The p-type semiconductor layered portion 12 is partially removed, to form a ridge stripe 20. More specifically, the p-type contact layer 19, the p-type AlGaN cladding layer 18 and the p-type GaN guide layer 17 are partially removed by etching, to form the ridge stripe 20 having a generally trapezoidal cross section. This ridge stripe 20 is formed along the c-axis direction.

The group III nitride semiconductor multilayer structure 2 has a pair of end faces 21 and 22 formed by cleaving both longitudinal ends of the ridge stripe 20. The pair of end faces 21 and 22 are parallel to each other, and both of the end faces 21 and 22, which are cleavage planes, are perpendicular to the c-axis. Thus, the n-type GaN guide layer 15, the light emitting layer 10 and the p-type GaN guide layer 17 constitute a Fabry-Perot resonator having resonator end faces 21 and 22 as the resonator end faces. In other words, the light emitted in the light emitting layer 10 reciprocates between the resonator end faces 21 and 22, and is amplified by induced emission. Part of the amplified light is extracted as a laser beam from the resonator end faces 21 and 22.

The n-side electrode 3 and the p-side electrode 4 are made of Al metal, for example, and in ohmic contact with the p-type contact layer 19 and the substrate 1 respectively. An insulating layer 6 covering the exposed surfaces of the n-type GaN guide layer 17 and the p-type AlGaN cladding layer 18 is so provided that the p-side electrode 4 is in contact with only the p-type GaN contact layer 19 provided on the top face of the ridge stripe 20. Thus, a current can be concentrated on the ridge stripe 20, thereby enabling efficient laser oscillation. In the semiconductor laser diode 70, the portion located immediately under the ridge stripe 20 on which the current is concentrated forms a waveguide 25 (light guide) for transmitting the light. In other words, the waveguide 25 is also orthogonal to the resonator end faces 21 and 22 (c-planes), similarly to the ridge stripe 20.

Further, the waveguide 25 has a width of 1 μm to 2 μm, for example. FIGS. 1 and 3 show the waveguide 25 in an enlarged manner.

According to this embodiment, the resonator end faces 21 and 22 are formed by c-planes (+c- and −c-planes). The resonator end face 21 is a +c-side end face, for example, and the resonator end face 22 is a −c-side end face, for example. In this case, the crystal plane of the resonator end face 21 is defined by the +c-plane, and that of the resonator end face 22 is defined by the −c-plane. Insulating films 23 and 24 different in reflectivity from each other are formed on the resonator end faces 21 and 22 respectively. More specifically, the insulating film 23 having smaller reflectivity is formed on the +c-side end face 21, and the insulating film 24 having larger reflectivity is formed on the −c-side end face 22. Therefore, the +c-side end face 21 emits a larger laser output. In other words, the +c-side end face 21 serves as a laser emitting end face in this semiconductor laser diode 70.

According to this structure, light having a wavelength of 400 nm to 550 nm can be emitted by connecting the n-side electrode 3 and the p-side electrode 4 to a power source and injecting the electrons and the positive holes into the light emitting layer 10 from the n-type semiconductor layered portion 11 and the p-type semiconductor layered portion 12 respectively thereby recombining the electrons and the positive holes in the light emitting layer 10. This light reciprocates between the resonator end faces 21 and 22 along the guide layers 15 and 17, and is amplified by induced emission. Thus, a higher laser output is extracted from the resonator end face 21 serving as the laser emitting end face.

A method of manufacturing the semiconductor laser diode 70 is now described.

Figure 4:
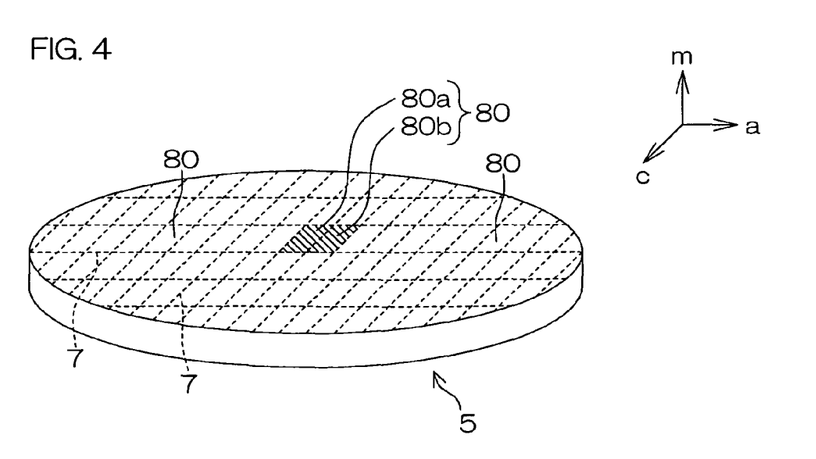
FIG. 4 is a perspective view schematically showing a wafer provided with individual devices.

In order to manufacture the semiconductor laser diode 70, individual devices 80 (group III nitride semiconductor substrates) each constituting the semiconductor laser diode 70 are formed on a wafer 5 constituting the aforementioned GaN monocrystalline substrate 1, as schematically shown in FIG. 4.

More specifically, the n-type semiconductor layered portion 11, the light emitting layer 10 and the p-type semiconductor layered portion 12 are epitaxially grown on the wafer 5 (in the state of the GaN monocrystalline substrate 1), thereby forming the group III nitride semiconductor multilayer structure 2. After the formation of the group III nitride semiconductor multilayer structure 2, the ridge stripe 20 is formed by dry etching, for example. Then, the insulating layer 6, the p-side electrode 4 and the n-side electrode 3 are formed. Thus, the wafer 5 is obtained in the state formed with each individual device 80. In advance of the formation of the n-side electrode 3, grinding/polishing (chemical mechanical polishing, for example) is performed from the back surface of the wafer 5 in order to reduce the thickness thereof, if necessary.

The respective individual devices 80 are formed on rectangular regions partitioned by tessellated cutting lines (virtual lines) virtually formed on the wafer 5. Therefore, the cutting lines 7 are along the c-planes and the a-planes of the individual devices 80.

The wafer 5 is divided into the respective individual devices 80 along the cutting lines 7. In other words, the wafer 5 is cleaved along the cutting lines 7, to cut out the individual devices 80.

The method of dividing the wafer 5 into the individual devices 80 is now specifically described.

Figure 5A:
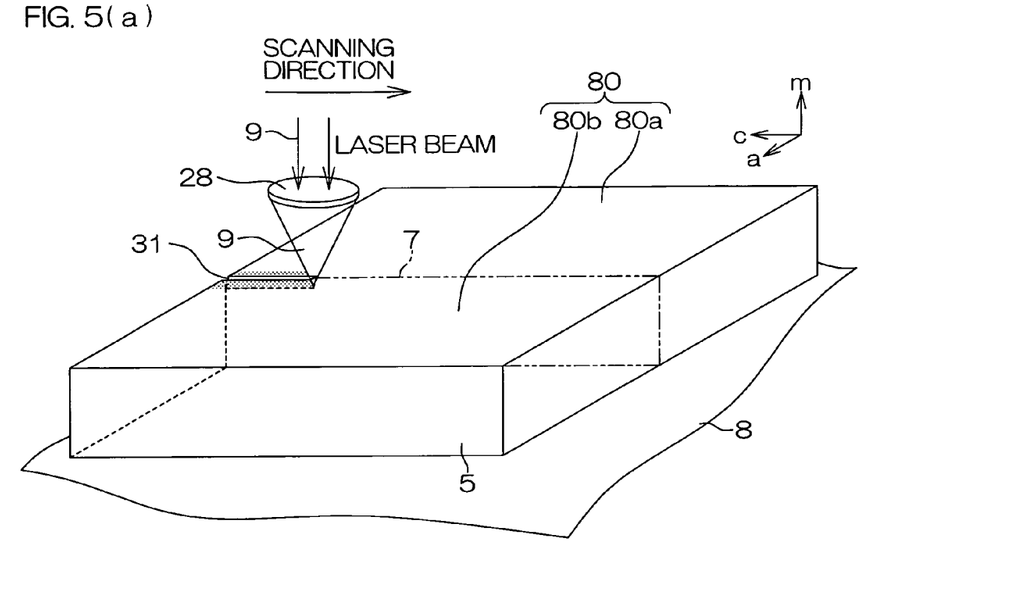
FIGS. 5(a) and 5(b) are schematic perspective views for illustrating formation of a division guide groove and subsequent cleaning respectively.
Figure 5B:
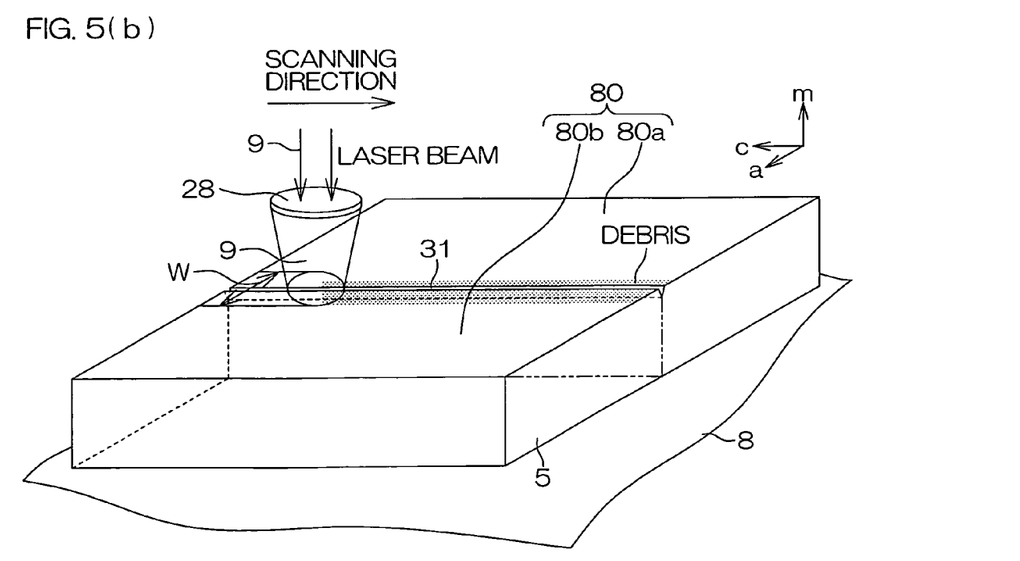

FIGS. 5(a) and 5(b) are schematic diagrams for illustrating the method of dividing the wafer 5 into the individual devices 80. FIGS. 5(a) and 5(b) illustrate only individual devices 80a and 80b, which are adjacent to each other in the a-axis direction as shown in FIG. 4, in a simplified manner, for the convenience of illustration. Referring to FIGS. 5(a) and 5(b), arrows c, m and a denote the c-axis direction, the m-axis direction and the ā-axis direction respectively.

In order to separate the individual devices 80a and 80b from each other, the wafer 5 including the individual devices 80a and 80b is first bonded to a support sheet 8, as shown in FIG. 5(a). This support sheet 8 is a pressure sensitive adhesive sheet for preventing scattering of the individual devices 80a and 80b cut out from the wafer 5.

The wafer 5 supported by the support sheet 8 may be directed upward for opposing the surface (closer to the n-side electrode 3) opposite to the group III nitride semiconductor multilayer structure 2 to the support sheet 8, or may be directed downward for opposing the surface closer to the group III nitride semiconductor multilayer structure 2 to the support sheet 8.

Then, a division guide groove 31 is formed on the surface of the wafer 5 along the cutting line 7 along the c-axis direction (i.e., in the direction parallel to the a-plane) with a laser processor. While detailed illustration of the structure is omitted, the laser processor includes a laser beam generating unit, a laser application head including a converging lens 28 converging a laser beam generated from the laser beam generating unit and an X-Y stage mechanism. FIG. 5 shows only the converging lens 28 among these elements. A YAG laser or an excimer laser, for example, can be employed as the laser beam generating unit. The X-Y stage mechanism includes a stage holding the wafer 5 through the support sheet 8 and a moving mechanism two-dimensionally moving this stage in two orthogonal directions X and Y (horizontal directions, for example). The X-Y stage mechanism may further includes a mechanism for moving the stage along a direction Z (vertical direction, for example) approximating/separating the stage to/from the converging lens 28, if necessary. The converging lens 28 is capable of converging the laser beam 9, and the focal length thereof may be rendered adjustable, if necessary. The distance between the converging lens 28 and the wafer 5 may be adjusted by approximating/separating the converging lens 28 to/from the stage of the X-Y stage mechanism, or by approximating/separating the stage of the X-Y stage mechanism to/from the converging lens 28. Thus, the positional relation between the focal point of the converging lens 28 and the wafer 5 can be adjusted. This positional relation can be adjusted by adjusting the focal length of the converging lens 28, as a matter of course.

The laser processor having the aforementioned structure scans the wafer 5 with the laser beam 9. More specifically, the laser processor scans the wafer 5 with the laser beam 9 along the cutting line 7 parallel to the c-axis of each individual device 80.

In the scanning process, the laser beam 9 may be regularly applied to the wafer 5, or the laser beam generating unit may be so on-off controlled as to intermittently apply the laser beam 9.

On each position irradiated with the laser beam 9 the laser beam 9 is converged on the surface of the wafer 5 to cause multiphoton absorption on the focal point. The focal point is scanned along the surface of the wafer 5, whereby the division guide groove 31 is formed on the boundary between the individual devices 80a and 80b along the cutting line 7. The division guide groove 31 is continuously formed if the laser beam 9 is regularly applied in the scanning process, while division guide grooves 31 divided in a perforated manner at a prescribed interval in the scanning direction are formed if the laser beam 9 is intermittently applied in the scanning process. However, FIGS. 5(a) and 5(b) show the continuous division guide groove 31.

The wavelength of the laser beam 9 for scanning the wafer 5 is 500 nm to 700 nm. The laser beam having the wavelength in this range is not absorbed by the group III nitride semiconductors on regions other than the focal point. At the focal point having high energy density, multiphoton absorption is caused. In other words, a next photon is incident before the group III nitride semiconductor materials excited to a virtual level between a base level and an excited level by incidence of a photon return to the base level through a certain time constant. Therefore, the group III nitride semiconductor materials are excited to the excited level (two-photon absorption). Thus, the division guide groove 31 is formed on the surface of the wafer 5 due to the multiphoton absorption.

The energy density of the laser beam 9 is preferably in the range of $1 \times 10^8$ W/cm$^2$ to $1 \times 10^{12}$ W/cm$^2$ ($3.0 \times 10^{10}$ W/cm$^2$, for example) at the focal point, for example. If the energy density of the laser beam 9 at the focal point is in this range, the surface of the wafer 5 can be excellently processed for excellently forming the division guide groove 31. The energy density of the laser beam 9 can be controlled by adjusting the output of the laser beam generating unit.

The moving speed for the wafer 5 (i.e., the moving speed for the stage) scanned with the laser beam 9 along the cutting line 7 is set to 3 mm/sec., for example.

The depth of the division guide groove 31 is about 10 μm, for example. If the wafer 5 is supported by the support sheet 8 in the state directed upward, the division guide groove 31 passes through the group III nitride semiconductor multilayer structure 2 to reach the GaN monocrystalline substrate 1. If the wafer 5 is supported by the support sheet 8 in the state directed downward, on the other hand, the division guide groove 31 is formed on the back surface of the wafer 5, not to reach the group III nitride semiconductor multilayer structure 2.

When the division guide groove 31 is formed by laser processing, the group III nitride semiconductor materials around the surface of the wafer 5 are heated and transformed, and scattered around the division guide groove 31 as debris. Therefore, a cleaning step for removing the debris is thereafter carried out as shown in FIG. 5(b).

The cleaning step is carried out by reducing the output of the laser beam generating unit, to cause no multiphoton absorption on the wafer 5. Further, the focal position of the converging lens 28 is so adjusted that the laser beam 9 is applied to regions of a prescribed width W (larger than the width of the division guide groove 31: W=10 μm to 50 μm, for example) around the division guide groove 31 on the surface of the wafer 5. In addition, the output of the laser beam generating unit is so reduced that the energy density of the laser beam 9 is about $1 \times 10^6$ W/cm$^2$ to $1 \times 10^9$ W/cm$^2$ ($5 \times 10^7$ W/cm$^2$, for example) on the surface of the wafer 5.

In this state, the laser processor scans the wafer 5 with the laser beam 9 along the cutting line 7. Thus, the laser beam 9 having low energy density is applied to the division guide groove 31 and the regions of the prescribed width W located on both sides of the division guide groove 31.

At this time, the laser beam 9 has the wavelength of 500 nm to 700 nm, as hereinabove described. The laser beam 9 in this wave range is not absorbed by the group III nitride semiconductors, to exert no influence on the GaN substrate 1 and the group III nitride semiconductor multilayer structure 2. On the other hand, the debris resulting from transformation of the group III nitride semiconductors is mainly composed of group III elements (main component: Ga) resulting from the group III nitride semiconductors losing nitrogen atoms. Therefore, the laser beam 9 in the aforementioned wave range is absorbed by the debris. Therefore, the debris irradiated with the laser beam 9 is sublimated and scattered to be removed from the surface of the wafer 5. Thus, the surface of the wafer 5 can be cleaned by removing the debris resulting from the formation of the division guide groove 31 by laser processing.

In order to reliably eliminate the sublimate of the debris, a suction mechanism is preferably provided for eliminating the sublimate of the debris from the surface of the wafer 5 by sucking the atmosphere in the vicinity of the regions irradiated with the laser beam 9.

Figure 6:
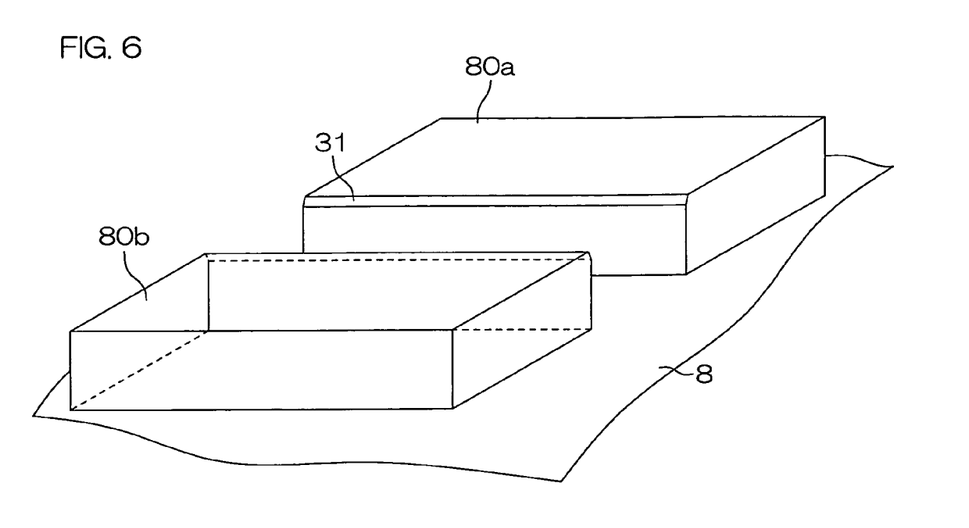
FIG. 6 is a schematic perspective view showing divided individual devices.

After the surface of the wafer 5 is cleaned, external force is applied to the wafer 5, thereby dividing the same into the individual devices 80a and 80b (dividing step), as shown in FIG. 6. More specifically, stress is externally applied to the wafer 5 along the division guide groove 31 to form a crack from the division guide groove 31, thereby dividing the wafer 5.

Due to the division on the cutting line 7 along the a-plane, the wafer 5 is divided into a plurality of bar-shaped bodies. Then, the plurality of bar-shaped bodies are separated from each other along the cutting line 7 along the c-plane. More specifically, the division guide groove 31 may be formed by laser processing similarly to the aforementioned case, and debris may be removed from a portion around the division guide groove 31 by cleaning with a laser beam of low energy density.

While cleavage along the a-plane or the m-plane is difficult, cleavage along the c-plane is relatively stable. Therefore, another dividing method may be applied to the cutting line 7 along the c-plane. For example, the division guide groove may be formed by mechanical processing with a diamond cutter or the like. Alternatively, the wafer 5 may be divided by causing multiphoton absorption of the laser beam 9 in the GaN substrate 1 thereby forming a processed region (region transformed by multiphoton absorption) in the GaN substrate 1 along the cutting line 7 and forming a crack from the processed region. Cleavage along the c-plane can be performed by externally applying stress to the wafer 5 divided into the plurality of bar-shaped bodies. Thus, excellent resonator end faces (c-planes) consisting of cleave planes can be obtained.

The procedure of dividing the wafer into the individual devices is not restricted to the above. For example, the wafer may be divided into bar-shaped bodies on cleavage planes along the c-planes, and the bar-shaped bodies may be divided along planes (a-planes, for example) perpendicular to the c-planes.

Thus, the plurality of individual devices 80 each having the same size as the semiconductor laser diode 70 are separated from the wafer 5. Then, the semiconductor laser diode 70 shown in FIG. 1 is obtained by forming the aforementioned insulating films (not shown) on the resonator end faces 21 and 22 of the obtained individual device 80.

According to this embodiment, as hereinabove described, the division guide groove 31 is formed with the laser beam 9 having the wavelength of 500 nm to 700 nm not absorbed by the group III nitride semiconductors (individual device 80), and a crack is formed from the division guide groove 31 to divide the wafer 5. Each individual device 80 divided into the size (chip size) of the semiconductor laser diode 70 is obtained through such dividing step. After the formation of the division guide groove 31, the laser beam of low energy density is applied to the division guide groove 31 and the regions of the prescribed width W located on both sides thereof, for removing the debris. Thus, the semiconductor laser diode 70 having a stable shape can be cut out from the wafer 5. The debris has been removed from the surface of the semiconductor laser diode 70 due to the cleaning with irradiation of the laser beam having low energy density, whereby defective appearance, defective die bonding, defective wire bonding etc. resulting from the debris can be reduced or avoided.

Figure 7A:
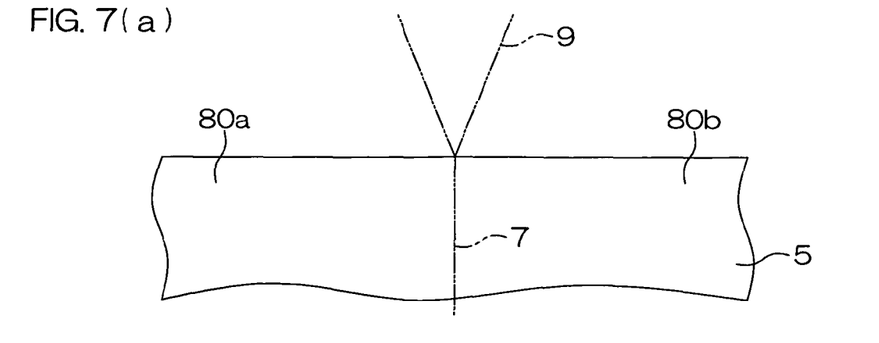
FIGS. 7(a) to 7(d) are schematic sectional views for illustrating the shape of a laser trace resulting from two-stage laser processing.
Figure 7B:
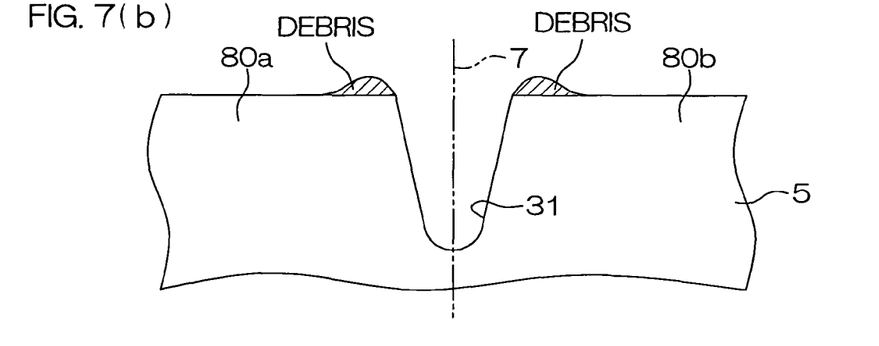

FIGS. 7(a) to 7(b) are schematic sectional views for illustrating the shape of a laser trace resulting from the two-stage laser processing. The section shown in FIGS. 7(a) to 7(d) is orthogonal to the division guide groove 31.

Figure 7C:
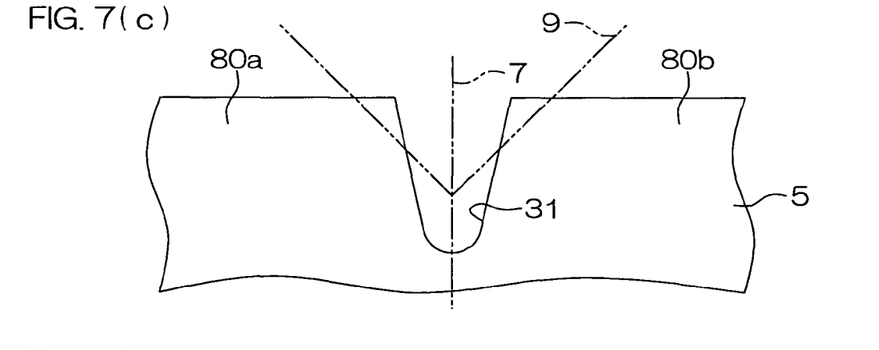

The first-stage laser processing (see FIG. 7(a): division guide groove forming step) for forming the division guide groove 31 and the second-stage laser processing (see FIG. 7(c): cleaning step) for removing the debris (see FIG. 7(b)) resulting from the first-stage laser processing are performed, as hereinabove described. While the second-stage laser processing is performed at energy density causing no multiphoton absorption on the wafer 5, the materials for the wafer 5 are lost following the removal of the debris. Further, the energy of the laser beam is slightly absorbed, and the materials for the wafer 5 are lost also by this.

Figure 7D:
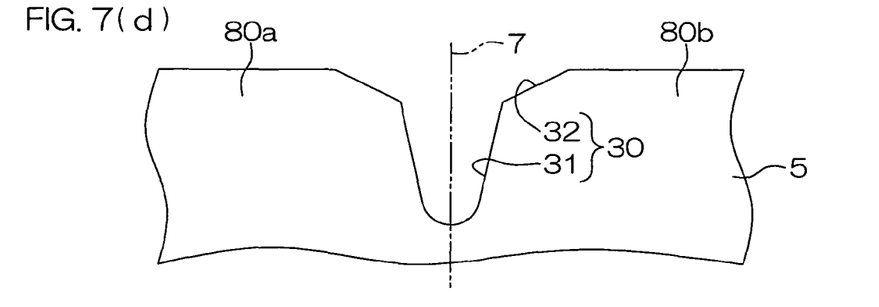

Consequently, a laser trace 30 formed on an edge of the individual device 80 has a second laser-processed surface 32 resulting from the aforementioned cleaning step on an edge of the division guide groove 31 as a first laser-processed surface. The first laser-processed surface (division guide groove 31) reaches a deep portion of the wafer 5, and has a large inclination angle with respect to the major surface of the wafer 5. On the other hand, the second laser-processed surface 32 is in such a state that the materials for the surface portion of the wafer 5 are slightly lost, and has a gentler inclination angle as compared with the first laser-processed surface (division guide groove 31). Thus, the laser trace 30 is a two-stage laser trace.

Figure 8:
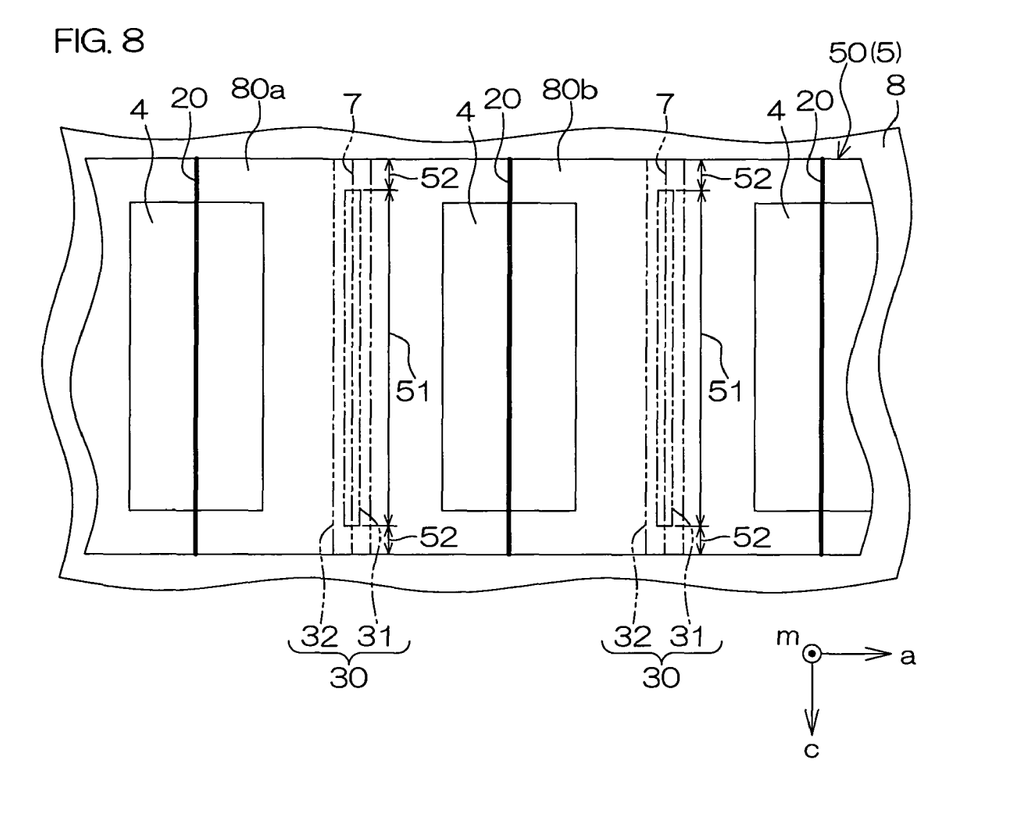
FIG. 8 is a schematic plan view for illustrating a method of manufacturing a nitride semiconductor device according to another embodiment of the present invention.

FIG. 8 is a schematic plan view for illustrating a method of manufacturing a nitride semiconductor device according to another embodiment of the present invention. According to this embodiment, a wafer 5 is first divided in relation to cutting lines 7 along c-planes, to form a bar-shaped body 50 extending along an a-axis. This bar-shaped body 50 is held on a support sheet 8, so that division guide grooves 31 are formed by laser processing. Referring to FIG. 8, numeral 20 denotes ridge stripes (resonators) along a c-axis direction.

The bar-shaped body 50 is divided along the cutting line 7 (a cutting line parallel to the c-axis direction) set between adjacent individual devices 80a and 80b. Laser processing with the aforementioned laser processor is executed along the cutting line 7. This laser processing includes first-stage laser processing for forming the division guide groove 31 and second-stage laser processing for cleaning debris resulting from the formation of the division guide groove 31. In this case, the first-stage laser processing is performed only in relation to a first region 51 at the center in the width direction of the bar-shaped body 50, and not performed as to second regions 52 on both end portions in the width direction of the bar-shaped body 50. On the other hand, the second-stage laser processing is performed over the whole region in the width direction of the bar-shaped body 50. Each of the second regions 52 preferably has a width of 5 μm to 20 μm (10 μm, for example) from the corresponding end face of the bar-shaped body 50. If the width of each second region 52 is smaller than 5 μm, the laser beam may damage the support sheet 8. If the width of each second region 52 exceeds 20 μm, on the other hand, burrs may be formed when the device is divided.

In the first-stage laser processing for forming the division guide groove 31, a laser beam of high energy density is applied to the wafer 5, so that multiphoton absorption can be caused on the materials for the wafer 5. If the laser processing is performed up to edges in the width direction of the bar-shaped body 50 at this time, the high-energy laser beam may be applied to the support sheet 8, to damage the support sheet 8. In the second-stage laser processing for removing the debris by cleaning, on the other hand, a laser beam of relatively low energy density is applied to the wafer 5, and hence there is a little possibility that the support sheet 8 is remarkably damaged by the laser beam. Therefore, the laser processing for forming the division guide groove 31 is performed in relation to only the first region 51 at the center in the laser beam scanning direction, and the laser processing for removing the debris is performed in relation to the overall region in the laser beam scanning direction. Thus, the debris can be reliably removed from the bar-shaped body 50 without damaging the support sheet 8.

Figure 9:
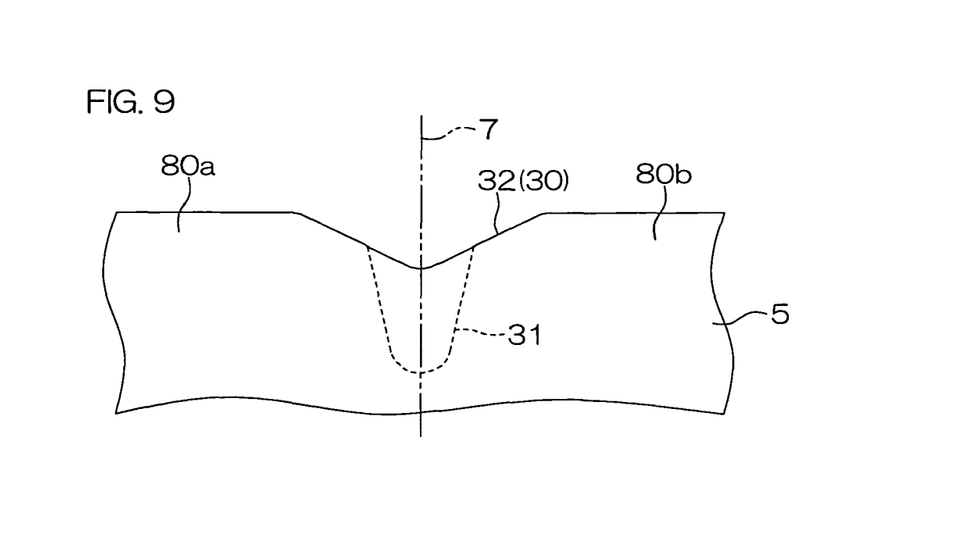
FIG. 9 is a schematic sectional view for illustrating the shape of a laser trace on an end portion of a region, scanned with a laser beam, of the device prepared according to the method shown in FIG. 8.

In this case, a laser trace 30 on an edge of each individual device 80 has a shape similar to that in the aforementioned first embodiment (see FIG. 7(*d*)) in the first region 51, while only a second laser-processed surface 32 corresponding to the second-stage laser processing is formed on each second region 52, as shown in FIG. 9. In other words, the depth of the laser trace 30 is relatively large in the first region 51, and relatively small in the second region 52. FIG. 9 shows a sectional shape of the division guide groove 31 with a broken line.

While the two embodiments of the present invention have been described, the present invention may be embodied in other ways.

For example, while the present invention is applied to manufacturing of the semiconductor laser diode in each of the aforementioned embodiments, the present invention is also applicable to manufacturing of other types of devices such as a light emitting diode (LED) and a transistor, so far as the devices are made of group III nitride semiconductors.

While the group III nitride semiconductor multilayer structure 2 is formed on the GaN monocrystalline substrate 1 in each of the aforementioned embodiments, the present invention is also applicable to manufacturing of a device having group III nitride semiconductor layers formed on a sapphire substrate or an SiC substrate. In this case, division guide grooves may be formed by laser processing from the surface not provided with the group III nitride semiconductor layers. When the sapphire or SiC substrate is employed, a laser beam having a wavelength of 355 nm, for example, is preferably employed. The laser beam having this wavelength is so employed at high energy density that division guide grooves can be formed by causing multiphoton absorption on the surface of the sapphire or SiC substrate. further, debris can be removed from the surface of the sapphire or SiC substrate without damaging the same by applying a laser beam having the wavelength of 355 nm at low energy density.

While the cleaning for removing the debris is performed by scanning the surface of the wafer 5 with the laser beam 9 at the low energy density along the division guide groove 31 in each of the aforementioned embodiments, the overall region of the surface of the wafer 5 may alternatively be scanned with the laser beam 9 at the low energy density.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2007-193409 filed in the Japanese Patent Office on Jul. 25, 2007, the disclosure of which is incorporated herein by reference in its entirety.

What is claimed is:

1. A nitride semiconductor device formed by growing a group III nitride semiconductor layer on a major surface of a substrate, having a two-stage laser trace on a device edge portion, wherein
   the laser trace includes a first processed surface having a first inclination angle with respect to the major surface, and a second processed surface having a second inclination angle with respect to the major surface,
   the second processed surface is located between the first processed surface and the major surface, and
   the first inclination angle is larger than the second inclination angle.

2. The nitride semiconductor device according to claim 1, wherein
   the laser trace includes a first region and a second region having different depths of processing.

3. The nitride semiconductor device according to claim 2, wherein
   the first region is formed at a center in a laser beam scanning direction, the second region is formed on an end portion in the laser beam scanning direction, and the depth of processing of the first region is larger than the depth of processing of the second region.

4. The nitride semiconductor device according to claim 1, wherein the group III nitride semiconductor layer forms a laser diode having a resonator, and the laser trace is formed parallel to the resonator.

5. The nitride semiconductor device according to claim 2, wherein
   the first region includes the first processed surface and the second processed surface, and
   the second region includes the second processed surface.

6. The nitride semiconductor device according to claim 3, wherein
   the first region includes the first processed surface and the second processed surface, and
   the second region includes the second processed surface.

* * * * *